United States Patent
Haga

(10) Patent No.: US 9,847,280 B2
(45) Date of Patent: Dec. 19, 2017

(54) METHOD FOR MANUFACTURING SEMICONDUCTOR DEVICE

(71) Applicant: ROHM CO., LTD., Kyoto (JP)

(72) Inventor: Motoharu Haga, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 15/498,463

(22) Filed: Apr. 26, 2017

(65) Prior Publication Data

US 2017/0243811 A1 Aug. 24, 2017

Related U.S. Application Data

(62) Division of application No. 13/503,027, filed as application No. PCT/JP2010/068478 on Oct. 20, 2010, now Pat. No. 9,666,501.

(30) Foreign Application Priority Data

Oct. 20, 2009 (JP) .................. 2009-241550
Oct. 20, 2009 (JP) .................. 2009-241551

(51) Int. Cl.
*H01L 23/495* (2006.01)
*H01L 21/48* (2006.01)
*H01L 23/00* (2006.01)

(52) U.S. Cl.
CPC .... *H01L 23/49513* (2013.01); *H01L 21/4842* (2013.01); *H01L 23/49548* (2013.01); *H01L 24/05* (2013.01); *H01L 24/29* (2013.01); *H01L 24/32* (2013.01); *H01L 24/33* (2013.01); *H01L 24/45* (2013.01); *H01L 24/48* (2013.01); *H01L 24/73* (2013.01); *H01L 24/83* (2013.01); *H01L 2224/04026* (2013.01); *H01L 2224/04042* (2013.01); *H01L 2224/05144* (2013.01); *H01L 2224/05155* (2013.01); *H01L 2224/05554* (2013.01); *H01L 2224/05624* (2013.01); *H01L 2224/05647* (2013.01); *H01L 2224/29083* (2013.01); *H01L 2224/29111* (2013.01);

(Continued)

(58) Field of Classification Search
CPC ......... H01L 21/67144; H01L 21/67721; H01L 23/495
See application file for complete search history.

(56) References Cited

U.S. PATENT DOCUMENTS

2002/0031869 A1  3/2002 Minamio et al.
2002/0084518 A1* 7/2002 Hasebe ............... H01L 23/3107
                                                                257/676

(Continued)

FOREIGN PATENT DOCUMENTS

JP   2001-179483 A   7/2001
JP   2006-253732 A   9/2006

(Continued)

*Primary Examiner* — Mohammad Choudhry
(74) *Attorney, Agent, or Firm* — Rabin & Berdo, P.C.

(57) ABSTRACT

A method for manufacturing a semiconductor device includes preparing a semiconductor chip having a back surface made of a Cu layer. The semiconductor chip is bonded to a die pad having a front surface made of Cu via a bonding material containing a dissimilar metal not containing Cu and Pb and a Bi-based material so that the Cu layer and the bonding material come into contact with each other. After the bonding, the die pad is then heat-treated.

2 Claims, 17 Drawing Sheets

(52) U.S. Cl.
CPC ............... *H01L 2224/29113* (2013.01); *H01L 2224/29147* (2013.01); *H01L 2224/32245* (2013.01); *H01L 2224/33505* (2013.01); *H01L 2224/45147* (2013.01); *H01L 2224/48091* (2013.01); *H01L 2224/48247* (2013.01); *H01L 2224/48465* (2013.01); *H01L 2224/73265* (2013.01); *H01L 2224/83948* (2013.01); *H01L 2924/10253* (2013.01)

(56) References Cited

U.S. PATENT DOCUMENTS

| | | |
|---|---|---|
| 2004/0056337 A1 | 3/2004 | Hasebe et al. |
| 2006/0197215 A1 | 9/2006 | Potter |
| 2007/0057021 A1 | 3/2007 | Ikeda et al. |
| 2008/0205013 A1 | 8/2008 | Oshika et al. |
| 2009/0108443 A1 | 4/2009 | Jiang |
| 2009/0159650 A1 | 6/2009 | Ikeda et al. |
| 2009/0189260 A1 | 7/2009 | Hasebe et al. |
| 2011/0095412 A1 | 4/2011 | Hasebe et al. |
| 2011/0223718 A1 | 9/2011 | Ikeda et al. |
| 2012/0007224 A1 | 1/2012 | Hasebe et al. |
| 2012/0007225 A1 | 1/2012 | Hasebe et al. |

FOREIGN PATENT DOCUMENTS

| | | |
|---|---|---|
| JP | 2007-067158 A | 3/2007 |
| JP | 2007-281412 A | 10/2007 |
| JP | 2008-211101 A | 9/2008 |
| TW | 200924093 A | 6/2009 |

* cited by examiner

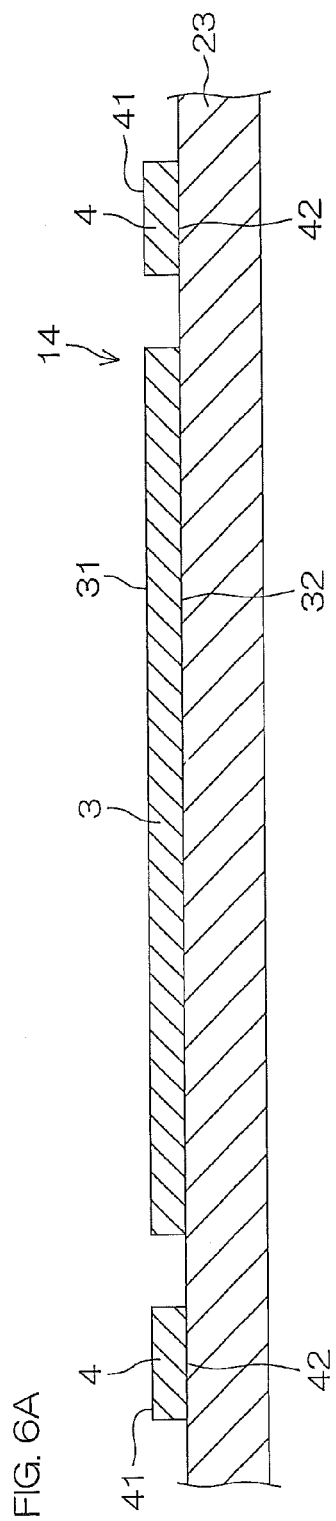

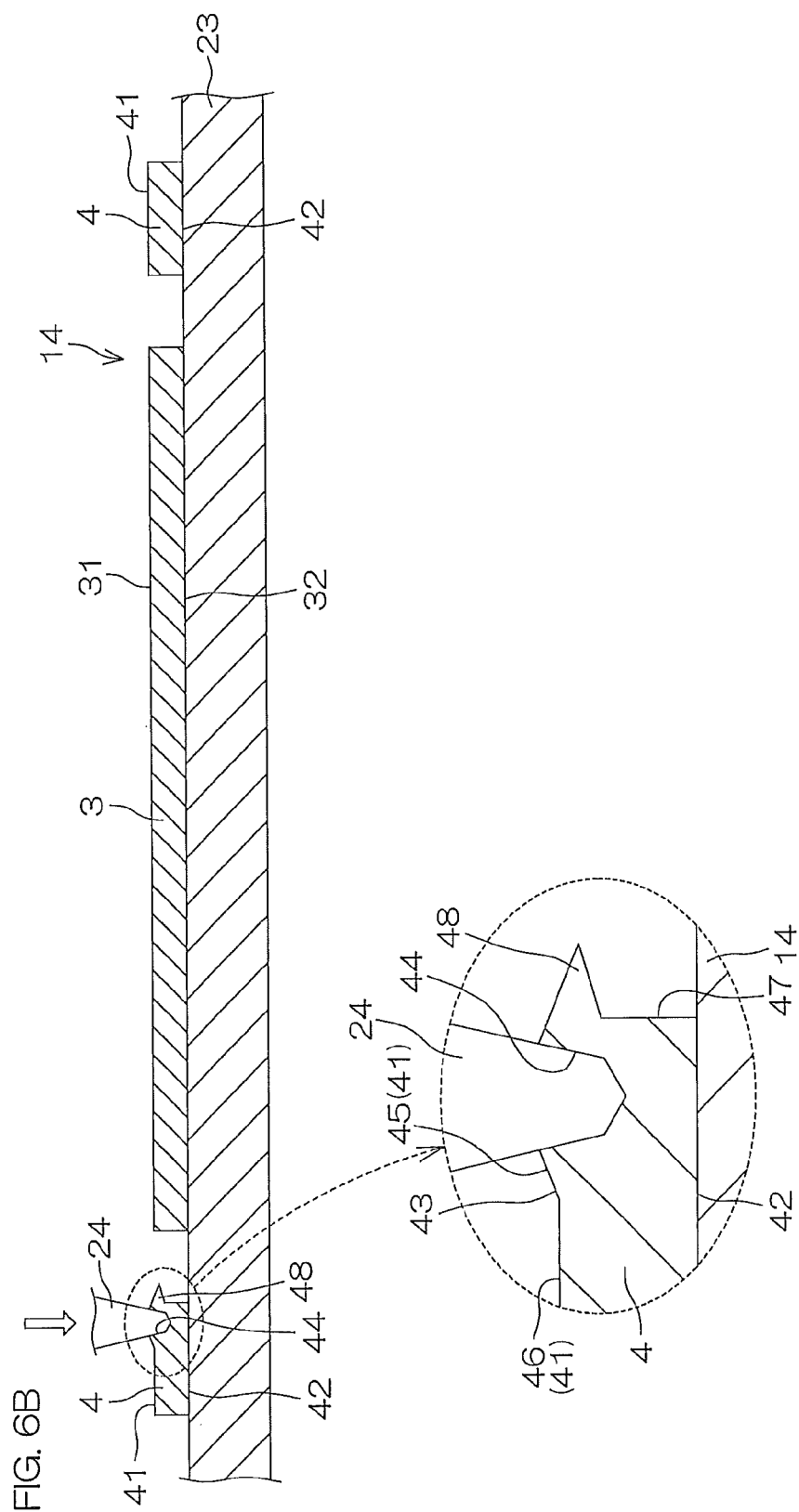

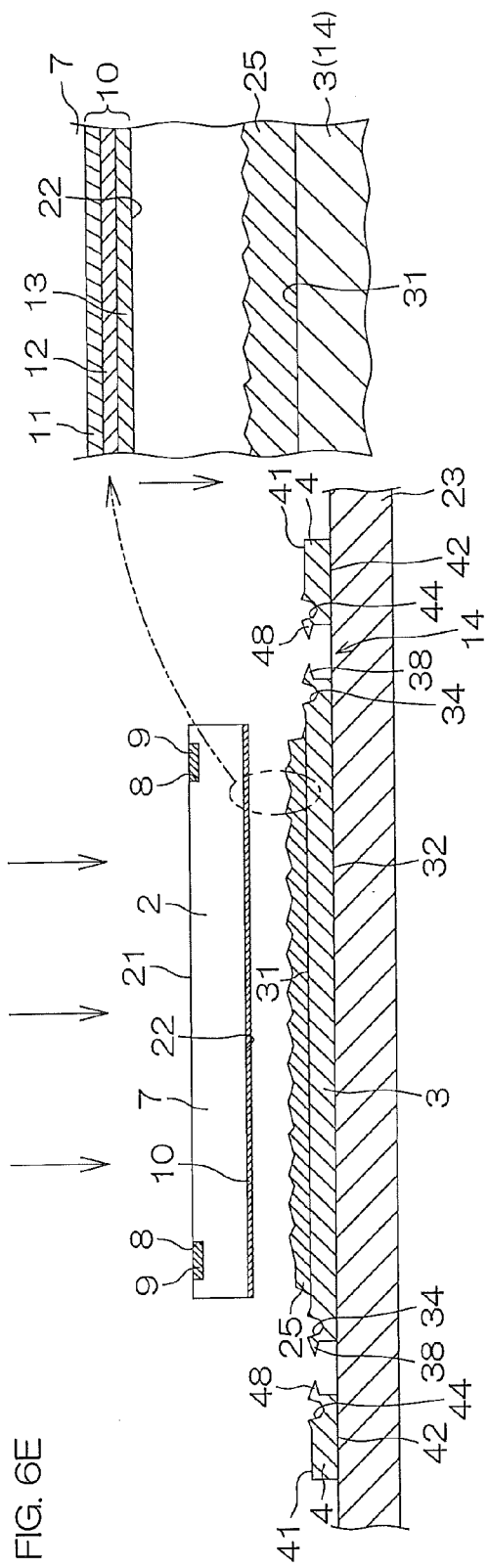

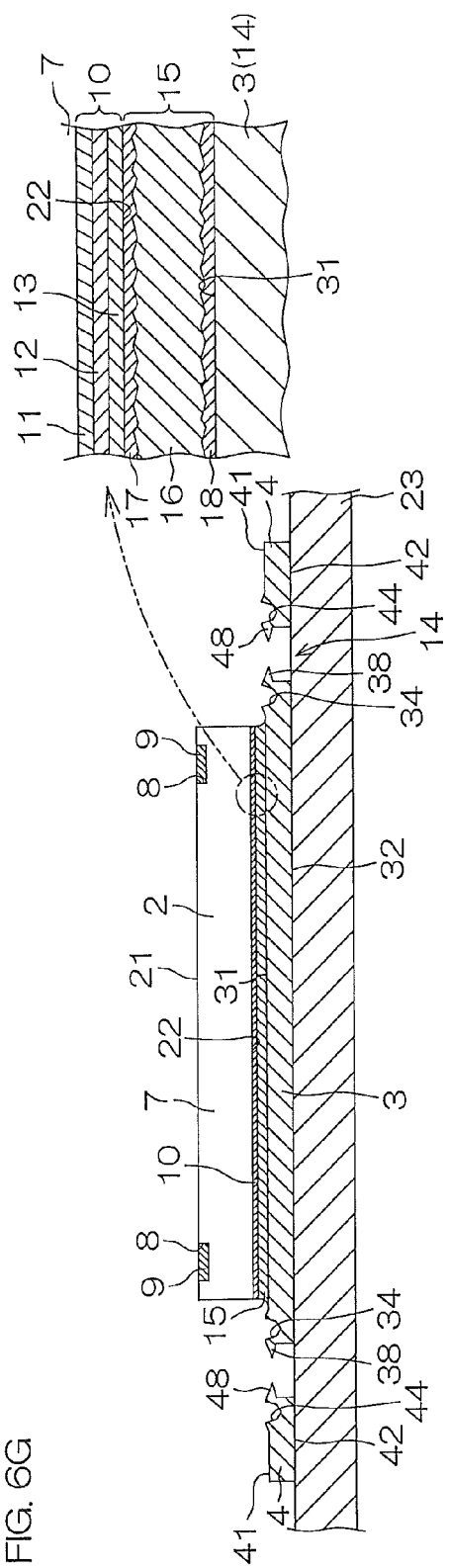

US 9,847,280 B2

METHOD FOR MANUFACTURING SEMICONDUCTOR DEVICE

CROSS-REFERENCE TO RELATED APPLICATIONS

This application is a divisional of U.S. application Ser. No. 13/503,027, filed on Apr. 19, 2012, and allowed on Jan. 23, 2017, which was a National Stage application of PCT/JP2010/068478, filed on Oct. 20, 2010. The prior US application and the present divisional application claim the benefit of priority of Japanese application No. 2009-241550 filed on Oct. 20, 2009 and Japanese application No. 2009-241551 filed on Oct. 20, 2009. The disclosures of these prior US and foreign applications are incorporated herein by reference.

TECHNICAL FIELD

The present invention relates to a semiconductor device and a method for manufacturing the same.

BACKGROUND ART

Conventionally, a reduction in the amount of lead to be used in semiconductor devices has been demanded from the viewpoint of environmental load.

In the semiconductor device, for example, lead has been used for outside components to be used outside the device, such as an exterior plating of an outer lead in an SOP (Small Outline Package) or a QFP (Quad Flat Package) and a solder ball in a BGA (Ball Grid Array). Lead has also been used for an inside component to be used inside the device such as a bonding material between a semiconductor chip and lead frame in the inside of the package.

Lead-freeing to make the content of lead to a fixed ratio or less has almost been achieved for the outer components through research of substitute materials. On the other hand, there is no material suitable as a substitute for the inside components. Therefore, for example, Pb-xSn-yAg (x and y are positive numbers), a lead-containing metal has been used.

PRIOR ART

Patent Document

Patent Document 1: Japanese Published Unexamined Patent Application No. 2007-67158

SUMMARY OF THE INVENTION

Problems to be Solved by the Invention

Bi easily reacts with metallic elements such as Au, Ag, and Ni normally contained in a metal layer formed at a bonding part to the bonding material in the semiconductor chip and lead frame. Bi forms compounds with the metallic elements or forms a eutectic composition.

Therefore, if the metallic elements such as Au, Ag, and Ni are exposed on an outermost surface of the metal layer, when Bi is used as the bonding material, an alloy layer (intermetallic compound) of Bi and the metallic elements is sometimes formed in the vicinity of an interface with the metal layer in the bonding material as a result of Bi contacting the metallic elements. Moreover, the bonding material as a whole is sometimes formed into a eutectic composition of Bi and the metallic elements.

The intermetallic compound of Bi and the metallic elements is hard and fragile and may thus serve as a starting point of fracture in a temperature cycle test (TCY test) of the semiconductor device.

Moreover, the melting point of a eutectic composition of Bi and the metallic elements is lower than that of Bi alone. For example, the melting point of Bi alone is approximately 271° C., while the melting point of a eutectic composition of Bi and Au is approximately 241° C., and the melting point of a eutectic composition of Bi and Ag is approximately 262° C. The bonding material may melt again in reflow (having a peak temperature of approximately 260° C.) for mounting the semiconductor device.

It is an object of the present invention to provide a semiconductor device for which lead-freeing can be achieved by using a Bi-based material for a bonding layer between a semiconductor chip and lead frame, and further, the melting point of the bonding layer can be maintained high while the temperature cycle resistance of the bonding layer can be improved and a method for manufacturing the same.

Means for Solving the Problems

A semiconductor device of the present invention to achieve the above-described object includes a die pad having a front surface made of Cu, a semiconductor chip disposed so as to be opposed to the front surface of the die pad, the semiconductor chip having a Cu layer forming a back surface thereof, and a bonding layer provided between the die pad and the semiconductor chip, and the bonding layer includes a Bi-based material layer and Cu alloy layers not containing Pb that sandwich the Bi-based material layer from both sides in an opposing direction of the die pad and the semiconductor chip with respect to the Bi-based material layer.

According to this configuration, since the bonding layer that bonds the die pad and the semiconductor chip is made of a Cu alloy not containing Pb and a Bi-based material, lead-freeing of the bonding layer can be achieved.

Moreover, the Bi-based material layer in the bonding layer is in contact with Cu alloy layers not containing Pb as a result of being sandwiched by the alloy layers from both sides in the opposing direction of the die pad and the semiconductor chip.

The Bi-based material layer is in contact with the Cu alloy layers, but since Cu hardly reacts with Bi, there is little possibility of the melting point of the bonding layer lowering or the temperature cycle resistance decreasing due to contact between these layers.

Moreover, even when there is formed a metal layer containing inhibitory metallic elements, such as Au, Ag, and Ni, that may degrade the characteristics of the Bi-based material layer in the die pad or semiconductor chip, contact of the Bi-based material layer with the metal layer can be prevented by the Cu alloy layers. As a result, the formation of intermetallic compounds of Bi and the inhibitory metallic elements and the formation of eutectic compositions of Bi and the inhibitory metallic elements can be prevented. Consequently, not only can the temperature cycle resistance of the bonding layer be improved, but the melting point of the bonding layer can also be maintained high.

The semiconductor device described above can be manufactured, for example, by a method for manufacturing a semiconductor device of the present invention. That is, the semiconductor device described above can be manufactured by a method for manufacturing a semiconductor device including a step of preparing a semiconductor chip having a back surface made of a Cu layer, a step of bonding the semiconductor chip to a die pad having a front surface made of Cu via a bonding material containing a dissimilar metal not containing Cu and Pb and a Bi-based material so that the Cu layer and the bonding material come into contact with each other, and a step of heat-treating the die pad after bonding the semiconductor chip.

According to this method, the semiconductor chip is bonded to the die pad so that the Cu layer of the semiconductor chip and the bonding material come into contact with each other, and thereafter, the die pad is heat-treated. Accordingly, each of the Cu layers of the semiconductor chip and Cu forming the front surface of the die pad and the dissimilar metal (metal not including Cu and Pb) in the bonding material react with each other to form Cu alloy layers in the vicinities of the Cu layer and the front surface of the die pad. On the other hand, the component other than the dissimilar metal in the bonding material hardly reacts with Cu, and thus remains, between the alloy layers, as a Bi-based material layer sandwiched by these layers.

In formation of the bonding layer, the components (Bi-based material and dissimilar metal) in the bonding material do not contact metallic elements other than Cu, and further, the alloy layers are formed on both sides of the Bi-based material layer in the opposing direction of the die pad and the semiconductor chip. Therefore, even when there is formed a metal layer containing inhibitory metallic elements, such as Au, Ag, and Ni in the die pad or semiconductor chip, contact of the Bi-based material layer with the inhibitory metallic elements can be prevented.

Further, when Sn is contained as the dissimilar metal in the bonding material, at least one of the Cu alloy layers can be formed as a Cu—Sn alloy layer. Moreover, when Zn is contained as the dissimilar metal in the bonding material, at least one of the Cu alloy layers can be formed as a Cu—Zn alloy layer.

Neither of the Cu—Sn alloy and Cu—Zn alloy is a hard and fragile metal like a Bi—Au alloy, a Bi—Ag alloy, or the like, but both are high-strength metals. Therefore, the bonding strength of the semiconductor chip and die pad and the bonding layer can be improved by these alloy layers.

Moreover, when the semiconductor chip includes a Si substrate on a back surface side of which the Cu layer is formed, it is preferable that a metal layer capable of making ohmic contact with a Si semiconductor is formed between the Si substrate and the Cu layer. Accordingly, the Cu layer and the Si substrate can be made conductive with each other via the metal layer. As a result, the Si substrate and the die pad can be electrically connected with each other.

Further, a semiconductor device in such a mode can be manufactured, for example, in the step of preparing a semiconductor chip of the method for manufacturing a semiconductor device of the present invention described above, by carrying out a step of forming a metal layer capable of making ohmic contact with a Si semiconductor at a back surface of the Si substrate and a step of forming the Cu layer on the metal layer.

Moreover, in the semiconductor device of the present invention, the die pad in cooperation with leads disposed therearound may make up a lead frame. That is, the die pad may be a part of the lead frame.

Moreover, when the semiconductor device of the present invention is a resin-encapsulated semiconductor device having a resin package, it is preferable that a back surface of the lead frame is provided as an exposed surface exposed from the resin package, a front surface of the lead frame is encapsulated by the resin package, and the die pad and/or the lead of the lead frame includes a deformed portion formed as a result of the encapsulated surface being deformed by a peripheral edge portion of the encapsulated surface being pressed from the encapsulated surface side and a projecting portion formed lateral to the deformed portion, projecting from a side surface of the die pad and/or the lead of the lead frame inside the resin package.

According to this configuration, to the inside of the resin package that encapsulates the side surface of the lead frame, a projecting portion projects from the side surface of the lead frame, and the projecting portion bites into the resin package. Therefore, when a force toward the lower surface side of the package (exposed surface side of the lead frame) is applied to the lead frame in an opposing direction of the encapsulated surface (front surface of the lead frame) and exposed surface (back surface of the lead frame), the projecting portion biting into the resin package is caught therein. As a result, the lead frame can be prevented from coming off.

Moreover, the encapsulated surface of the lead frame is not the same plane in its entire region, but has a deformed portion in its peripheral edge portion. Therefore, depending on the shape of the deformed portion, when a force is applied to the lead frame in a horizontal direction perpendicular to the opposing direction of the encapsulated surface and exposed surface, the peripheral edge portion of the encapsulated surface serves as resistance against the horizontal force. As a result, horizontal shifting of the lead frame can be suppressed as compared with when the entire region of the encapsulated surface of the lead frame is the same plane.

That is, this configuration can provide a semiconductor device capable of suppressing horizontal shifting of the lead frame while preventing the lead frame from coming off the resin package.

The deformed portion may be a recess formed as a result of the encapsulated surface being recessed in a thickness direction of the lead frame. In this case, since the recess is formed in the encapsulated surface, the resin package is fitted in part with the recess as a result of the resin package entering inside the recess. Therefore, when the horizontal force is applied to the lead frame, the recess is caught on the resin package inside the recess. As a result, horizontal shifting of the lead frame can be prevented.

Moreover, it is preferable that a peripheral portion of the recess in the encapsulated surface is raised. In this case, as a result of the peripheral portion of the recess rising, the encapsulated surface is bulging in part in the opposing direction. Therefore, when the horizontal force is applied to the lead frame, the bulging part serves as resistance to horizontal shifting. As a result, horizontal shifting of the lead frame can be prevented more reliably.

Moreover, it is preferable that a protrusion is formed inside the recess. In this case, since the protrusion is formed inside the recess, the protrusion projects to the inside of the resin package within the recess. The protrusion allows, inside the recess, the lead frame to bite into the resin package. Therefore, a complicated fitting structure between the recess and resin package can be provided. As a result, the fitting strength of the resin package with respect to the recess can be improved.

Moreover, the lead frame may be made of Cu. In that case, the front surface of the lead frame may be an uncoated surface that is not coated with a metal layer through a process such as plating or sputtering. That is, Cu that forms the lead frame may be exposed on the whole of the front surface of the lead frame. Accordingly, it is unnecessary, in manufacturing of the semiconductor device, to apply a process such as plating or sputtering to the lead frame, so that the cost can be reduced.

Moreover, in the lead frame made of Cu, the die pad on which the semiconductor chip is mounted may have a stacked structure including a metal layer not containing Cu and a frame-side Cu layer that are stacked in order toward the front surface side of the die pad.

Examples of the metal layer include an Ag layer, an Au layer, and a Ni layer. In that case, in a plurality of leads disposed around the die pad, it is preferable that the metal layer is exposed on an outermost surface of the lead. By appropriately selecting the type of the metal layer, various wires such as an Au wire and a Cu wire can be used as a bonding wire to be connected to the lead.

Moreover, in the method for manufacturing a semiconductor device of the present invention, the step of bonding the semiconductor chip may include a step of bonding the semiconductor chip to the die pad of a lead frame including the die pad and a plurality of leads disposed around the die pad.

In that case, the method for manufacturing a semiconductor device of the present invention may further include a step of forming a deformed portion and a projecting portion projecting from a side surface of the lead frame, to be carried out prior to the step of bonding the semiconductor chip, by pressing, from a front surface side of the die pad and/or the lead of the lead frame, a peripheral edge portion of the front surface with a capillary of a wire bonder or a stamping tool fitted to the wire bonder in place of the capillary to deform the front surface and a step of, after heat treatment of the lead frame, encapsulating the front surface side of the lead frame by a resin package so that the back surface of the lead frame is exposed.

According to this method, the deformed portion and projecting portion are formed by pressing the peripheral edge portion of the front surface of the lead frame with the stamping tool. Therefore, even when the back surface (surface to be exposed from the resin package) of the lead frame is covered and etching from the back surface side is difficult, the projecting portion (retaining structure) to prevent the lead frame from coming off can be reliably formed. Moreover, since the lead frame is pressed by using a capillary of a wire bonder or a stamping tool fitted to the wire bonder in place of the capillary, the lead frame can be simply and accurately deformed focusing on the peripheral edge portion of the lead frame.

That is, this configuration can provide a method for manufacturing a semiconductor device capable of simply and accurately forming a retaining structure in the lead frame even when it is difficult to form the retaining structure by etching.

Moreover, in the semiconductor device of the present invention, an electrode pad may be formed on a front surface of the semiconductor chip. In this case, the electrode pad may be made of a metallic material containing Al.

Moreover, in the semiconductor device of the present invention, the metal layer formed between the Si substrate and the Cu layer may be an Au layer. In that case, it is preferable to further include a Ni layer formed between the Si substrate and the Au layer. Moreover, the Si substrate may have a thickness of 220 µm to 240 µm.

Moreover, in the semiconductor device of the present invention, it is preferable that the lead frame is formed by a plating method. In that case, the lead frame may have a thickness of 10 µm to 50 µm.

Moreover, in the semiconductor device of the present invention, the die pad may have a quadrilateral shape in a plan view, and the leads may be disposed so as to surround the four sides of the die pad. That is, the semiconductor device of the present invention may be a semiconductor device to which a QFN (Quad Flat Non-leaded) package is applied.

In that case, it is preferable that the die pad has a quadrilateral shape larger than the semiconductor chip in a plan view, and the peripheral edge portion of the encapsulated surface of the die pad surrounds the semiconductor chip.

Moreover, in the semiconductor device of the present invention, the bonding layer may have a total thickness of 12 µm to 36 µm, the total thickness being a total of a thickness of the Bi-based material layer and thicknesses of the Cu alloy layers. Moreover, the thickness of the Bi-based material layer may have a thickness of 10 µm to 30 µm. Moreover, the Cu alloy layer may have a thickness of 1 µm to 3 µm.

BRIEF DESCRIPTION OF DRAWINGS

FIG. 6A is a schematic sectional view showing a part of a manufacturing process of the semiconductor device shown in FIG. 1 and FIG. 2.

FIG. 6B is a schematic sectional view showing a next step of FIG. 6A.

FIG. 6E is a schematic sectional view showing a next step of FIG. 6D.

FIG. 6G is a schematic sectional view showing a next step of FIG. 6F.

DESCRIPTION OF EMBODIMENTS

Hereinafter, embodiments of the present invention will be described in detail with reference to the accompanying drawings.

First Embodiment

Figure 1:
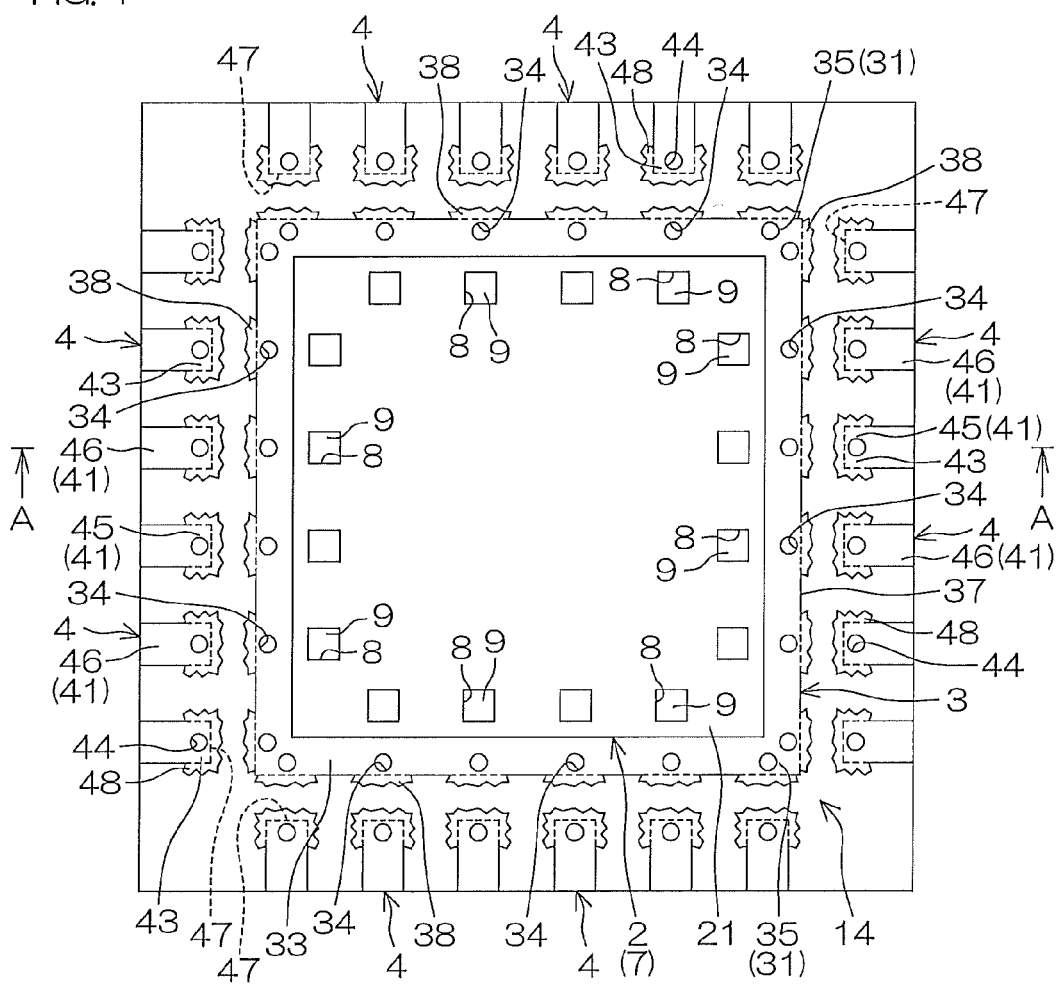
FIG. 1 is a schematic plan view of a semiconductor device according to a first embodiment of the present invention.
Figure 2:
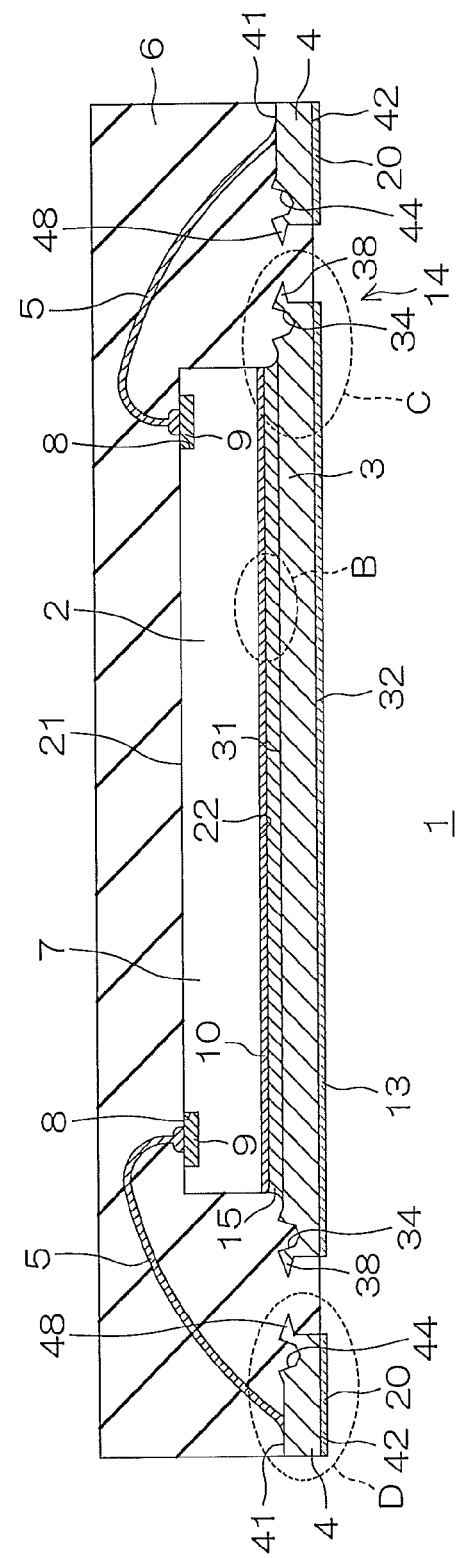
FIG. 2 is a schematic sectional view of the semiconductor device according to the first embodiment of the present invention, showing a section taken along a cut line A-A of FIG. 1.
Figure 3:
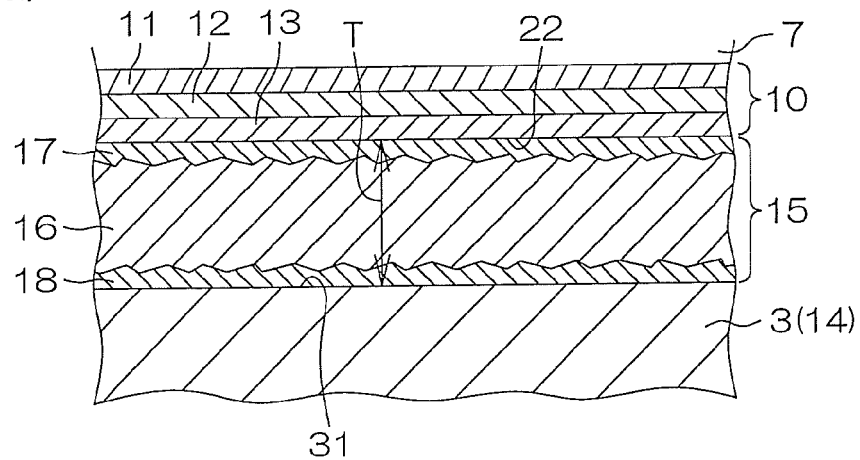
FIG. 3 is an essential-part enlarged view of a part surrounded by a dashed line circle B of FIG. 2.
Figure 4:
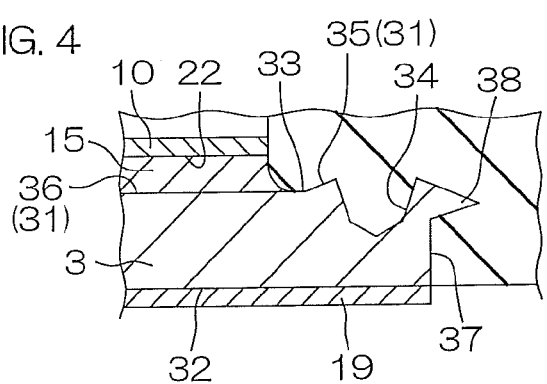
FIG. 4 is an essential-part enlarged view of a part surrounded by a dashed line circle C of FIG. 2.
Figure 5:
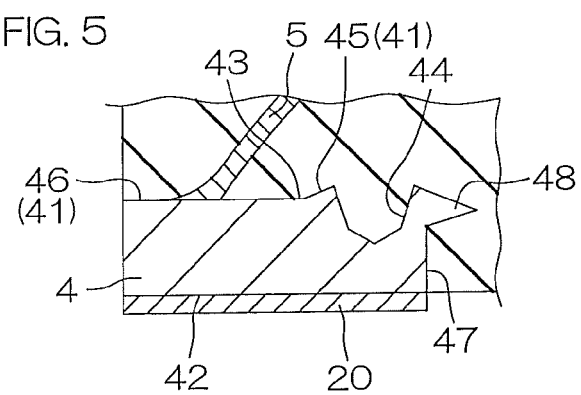
FIG. 5 is an essential-part enlarged view of a part surrounded by a dashed line circle D of FIG. 2.

FIG. 1 is a schematic plan view of a semiconductor device according to a first embodiment of the present invention. FIG. 2 is a schematic sectional view of the semiconductor device according to the first embodiment of the present invention, showing a section taken along a cut line A-A of FIG. 1. FIG. 3 is an essential-part enlarged view of a part surrounded by a dashed line circle B of FIG. 2. FIG. 4 is an essential-part enlarged view of a part surrounded by a dashed line circle C of FIG. 2. FIG. 5 is an essential-part enlarged view of a part surrounded by a dashed line circle D of FIG. 2. In addition, FIG. 1 shows a state where a resin package has been removed.

The semiconductor device 1 is a semiconductor device to which a QFN (Quad Flat Non-leaded) package is applied. The semiconductor device 1 includes a semiconductor chip 2 having a front surface 21 and a back surface 22, a die pad 3 on which the semiconductor chip 2 is mounted, a plurality of electrode leads 4 disposed around the die pad 3, a bonding wire 5 that electrically connects the semiconductor chip 2 and the electrode lead 4, and a resin package 6 for encapsulating these elements.

The semiconductor chip 2 includes a Si substrate 7 having a quadrilateral shape (for example, a quadrilateral of approximately 2.3 mm×2.3 mm) in a plan view. The thickness of the Si substrate 7 is, for example, 220 µm to 240 µm (preferably, approximately 230 µm). On an upper surface of the Si substrate 7, a multilayer wiring structure (not shown) formed of a plurality of wiring layers stacked via an interlayer insulating film is formed, and an outermost surface of the multilayer wiring structure is covered with a surface protective film (not shown).

In the surface protective film, a plurality of pad openings 8 to expose an uppermost wiring layer in the multilayer wiring structure are formed. The pad openings 8 are quadrilateral in a plan view, and are provided in the same number (in FIG. 1, four each) for edges of the semiconductor chip 2. The pad openings 8 are disposed at equal intervals along the sides of the semiconductor chip 2. The wiring layer is exposed in part, as electrode pads 9 of the semiconductor chip 2, from the pad openings 8. The surface with the pad openings 8 formed forms the front surface 21 of the semiconductor chip 2.

The uppermost wiring layer exposed as the electrode pads 9 is made of, for example, a metallic material containing Al (aluminum), and specifically, made of a metallic material (for example, an Al—Cu alloy) composed mainly of Al.

On the other hand, on a lower surface (opposing surface to the die pad 3) of the Si substrate 7, a back metal 10 is formed. The back metal 10 forms the back surface 22 of the semiconductor chip 2.

The back metal 10 has a three-layer structure in which, as shown in FIG. 3, in order from the side of the Si substrate 7, an Au layer 11, a Ni layer 12, and a Cu layer 13 are stacked. The Au layer 11 is capable of making ohmic contact with a Si semiconductor, and is in contact with the lower surface of the Si substrate 7. The Ni layer 12 is formed closer to the Si substrate 7 side than the Cu layer 13 that forms an outermost surface of the back metal 10, and is a layer to prevent a Si nodule where Si in the Si substrate 7 precipitates on the outermost surface of the back metal 10.

The die pad 3 and the electrode leads 4 are formed as a lead frame 14 made of the same metal thin plate. The lead frame 14 is formed by, for example, a plating method. Examples of a metallic material to be used for plating growth include Cu-based raw materials mainly containing Cu, specifically, high purity copper with a purity of 99.9999% (6N) or more and a purity of 99.99% (4N) or more and an alloy (for example, a Cu—Fe—P alloy) of Cu and a dissimilar metal and Fe-based raw materials such as a 42 alloy (Fe-42% Ni). Moreover, the thickness of the lead frame 14 is, for example, less than 100 µm, and preferably, 10 µm to 50 µm.

The die pad 3 has a quadrilateral shape (for example, an approximately 2.7 mm square in a plan view) larger than the semiconductor chip 2 in a plan view, in which a quadrilateral annular peripheral edge portion 33 surrounds the semiconductor chip 2.

A front surface 31 (encapsulating surface to be encapsulated by the resin package 6) of the die pad 3 is an uncoated surface that is not coated with a metal thin film through a process such as plating or sputtering, and a Cu-based raw material that forms the lead frame 14 is exposed on the whole of the front surface 31.

In the peripheral edge portion 33 of the die pad 3, as shown in FIG. 4, a plurality of minute pin recesses 34 (deformed portions) are formed for which the front surface 31 of the die pad 3 is recessed in the thickness direction of the lead frame 14.

The pin recesses 34 on the die pad 3 side are provided in the same number (in FIG. 1, six each) for straight portions of the peripheral edge portion 33. The pin recesses 34 are disposed at equal intervals along the sides of the peripheral edge portion 33. Each pin recess 34 has a tapered, substantially bowl shape in a sectional view whose diameter is reduced in the depth direction, and has, for example, a maximum diameter of 10 µm to 50 µm and a depth of 5 µm to 25 µm. In the front surface 31 of the die pad 3, a peripheral surface 35 having a circular annular shape in a plan view that surrounds each pin recess 34 is raised with respect to a mounting surface 36 on which the semiconductor chip 2 is mounted in the front surface 31. The mounting surface 36 is a surface parallel to a back surface 32 (mounting surface onto a wiring board) of the die pad 3.

Moreover, in a side surface 37 of the die pad 3, retainer portions 38 (projecting portions) that project in a direction perpendicular to the thickness direction of the lead frame 14 are formed at positions opposed to the pin recesses 34 of the peripheral edge portion 33, respectively. Each retainer portion 38 is formed at an upper side in the thickness direction of the lead frame 14, and is, in a sectional view, adjacent to each pin recess 34.

The semiconductor chip 2 and the die pad 3 are bonded to each other, with the lower surface (back surface 22 of the semiconductor chip 2) of the Si substrate 7 and the front surface 31 (mounting surface 36) of the die pad 3 opposed to each other as bonding surfaces, by interposing a bonding layer 15 between the back surface 22 and the front surface 31. Accordingly, the semiconductor chip 2 in a position where the front surface 21 is facing upward is supported on the die pad 3.

The bonding layer 15, as shown in FIG. 3, includes a Bi-based material layer 16 as a relatively thick main layer and Cu—Sn alloy layers 17, 18 as relatively thin sublayers.

The Bi-based material layer 16 contains Bi as a main component, and may contain accessory components such as Sn, Zn, and Co of such amounts so as not to have effect on the properties of Bi.

The Cu—Sn alloy layers 17, 18 are made of an alloy of Cu and Sn that is a dissimilar metal not containing Cu and Pb, and in which Cu is contained as a main component.

The Cu—Sn alloy layer 17 on the semiconductor chip 2 side is, in the vicinity of an interface with the Cu layer 13 of the back metal 10 in the bonding layer 15, formed across its entire region. Accordingly, the Cu—Sn alloy layer 17 is in contact with the Cu layer 13 of the back metal 10. The Cu—Sn alloy layer 17 has, for example, a stacked structure represented by Cu6Sn5/Cu3Sn, in the opposing direction of the die pad 3 and the semiconductor chip 2, from the side of the Bi-based material layer 16 toward the semiconductor chip 2 side.

The Cu—Sn alloy layer 18 on the die pad 3 side is, in the vicinity of an interface with the front surface 31 of the die pad 3 in the bonding layer 15, formed across its entire region. Accordingly, the Cu—Sn alloy layer 18 is in contact with the front surface 31 of the die pad 3. The Cu—Sn alloy layer 18 has, for example, a stacked structure represented by Cu6Sn5/Cu3Sn, in the opposing direction of the die pad 3 and the semiconductor chip 2, from the side of the Bi-based material layer 16 toward the die pad 3 side.

The Cu—Sn alloy layers 17, 18 may be partially formed in the vicinity of an interface with the front surface 31 of the die pad 3 in the bonding layer 15 and the vicinity of an interface with the Cu layer 13 of the back metal 10 in the bonding layer 15, respectively.

The Bi-based material layer 16 and the Cu—Sn alloy layers 17, 18, between the front surface 31 of the die pad 3 and the Cu layer 13 of the back metal 10, form a three-layer structure (Cu—Sn alloy layer 17/Bi-based material layer 16/Cu—Sn alloy layer 18) in which the Bi-based material layer 16 is sandwiched, from both sides in the opposing direction of the die pad 3 and the semiconductor chip 2, by the Cu—Sn alloy layers 17, 18.

The melting point of the bonding layer 15 as described above is, for example, 260° C. to 265° C., and preferably, 265° C. to 271° C. Moreover, in a state where the semiconductor chip 2 and the die pad 3 are bonded, the total thickness T (total of the thickness of the Bi-based material layer 16 and the thicknesses of the Cu—Sn alloy layers 17, 18) of the bonding layer 15 is, for example, 12 μm to 36 μm. As the thicknesses of the respective layers, for example, the thickness of the Bi-based material layer 16 is 10 μm to 30 μm, and the thicknesses of the Cu—Sn alloy layers 17, 18 are 1 μm to 3 μm.

The back surface 32 (mounting surface onto a wiring board) of the die pad 3 is exposed from the resin package 6. On the exposed back surface 32, for example, a die pad back surface plating 19 made of a metallic material such as tin (Sn) or a tin-silver alloy (Sn—Ag) is formed.

The electrode leads 4 are, as shown in FIG. 1, as a result of being disposed at both sides in directions perpendicular to the side surfaces 37 of the die pad 3, disposed around the die pad 3. The electrode leads 4 opposed to the side surfaces 37 of the die pad 3 are disposed at equal intervals in directions parallel to their opposing side surfaces 37. Each electrode lead 4 is formed to have a rectangular shape in a plan view that is longer in a direction perpendicular to the side surface 37 of the die pad 3 (direction opposed to the die pad 3), and its length in the opposing direction (length at a back surface 42 side) is, for example, approximately 450 μm.

A front surface 41 (connecting surface of the bonding wire 5) of the electrode lead 4 is, as shown in FIG. 5, an uncoated surface that is not coated with a metal thin film through a process such as plating or sputtering, and a Cu-based raw material that forms the lead frame 14 forms the whole of the front surface 41.

At edge portions 43 on the die pad 3 side in the electrode leads 4, a plurality of minute pin recesses 44 (deformed portions) are formed, respectively, for each of which the front surface 41 (encapsulating surface to be encapsulated by the resin package 6) of the electrode lead 4 is recessed in the thickness direction of the lead frame 14.

The pin recess 44 on the electrode lead 4 side has a substantially bowl shape in a sectional view whose diameter is reduced in the depth direction, and has, for example, a maximum diameter of 10 μm to 50 μm and a depth of 5 μm to 25 μm. In the front surface 41 of the electrode lead 4, a peripheral surface 45 having a circular annular shape in a plan view that surrounds each pin recess 44 is raised with respect to a connecting surface 46 to which the bonding wire 5 is connected in the front surface 41. The connecting surface 46 is a surface parallel to the back surface 42 (mounting surface onto a wiring board) of the electrode lead 4.

Moreover, in a side surface 47 of the electrode lead 4, a retainer portion 48 (projecting portion) that projects in a direction perpendicular to the thickness direction of the lead frame 14 is formed so as to surround the pin recess 44 at the edge portion 43 in a plan view. Each retainer portion 48 is formed at an upper side in the thickness direction of the lead frame 14, and is adjacent to the pin recess 44 in a sectional view.

The back surface 42 (mounting surface onto a wiring board) of the electrode lead 4 is exposed from the resin package 6. On the exposed back surface 42, for example, a lead back surface plating 20 made of a metallic material such as tin (Sn) or a tin-silver alloy (Sn—Ag) is formed.

The bonding wire 5 is made of, for example, copper (for example, high purity copper with a purity of 99.9999% (6N) or more and a purity of 99.99% (4N) or more, in which a minute amount of impurities is sometimes contained.) The bonding wire 5 connects a single electrode pad 9 and a single electrode lead 4 one to one.

The resin package 6 defines an external form of the semiconductor device 1, and is formed to have a substantially rectangular parallelepiped shape. In terms of the size of the resin package 6, its planar size is, for example, an approximately 4 mm square, and its thickness is approximately 0.85 mm. The resin package 6 is made of, for example, a publicly known molding resin such as an epoxy resin, and encapsulates the semiconductor chip 2, the bonding wires 5, and the lead frame 14 so as to cover the front surfaces 31, 41 and side surfaces 37, 47 of the lead frame 14 and expose the back surfaces 32, 42. The resin package 6, in each of the peripheral edge portion 33 of the die pad 3 and the edge portions 43 of the electrode leads 4, enters in the pin recess 34 or the pin recess 44.

FIG. 6A to FIG. 6G are schematic sectional views showing a manufacturing process in the order of steps of the semiconductor device shown in FIG. 1 and FIG. 2.

For manufacturing the semiconductor device 1 described above, for example, as shown in FIG. 6A, the lead frame 14 is formed by making a material of the lead frame 14 grow by a plating method, on a stainless steel substrate 23, in a pattern with a plurality of units including the die pads 3 and the electrode leads 4. In FIG. 6A to FIG. 6G, an overall view of the lead frame 14 is omitted, and only the die pad 3 and electrode leads 4 for a single unit necessary for mounting a single semiconductor chip 2 are shown.

Then, as shown in FIG. 6B, a stamping tool 24 is driven into the edge portion 43 on the die pad 3 side of the electrode lead 4 vertically with respect to the front surface 41. The stamping tool 24 is fitted, to a wire bonder to be used for wire bonding to be described later, in replacement of its capillary. By driving of the stamping tool 24, the pin recess 44 on the electrode lead 4 side is formed at the edge portion 43 of the electrode lead 4 as a dent of the stamping tool 24. Simultaneously with the formation of the pin recess 44, as a result of the periphery of the pin recess 44 in the electrode lead 4 being pressed and expanded by the stamping tool 24, the peripheral surface 45 of the electrode lead 4 surrounding the pin recess 44 rises, and the retainer portion 48 projects from the side surface 47 of the electrode lead 4 adjacent to the pin recess 44.

A load to be applied to the electrode lead 4 by the stamping tool 24 varies depending on the depth of the pin recess 44 aimed at, but is, for example, approximately 200 g/mm$^2$ to 400 g/mm$^2$. As the stamping tool 24, for example, a stamping capillary without a hole through which a wire or the like is inserted (for example, manufactured by TOTO company) can be applied.

Figure 6C:
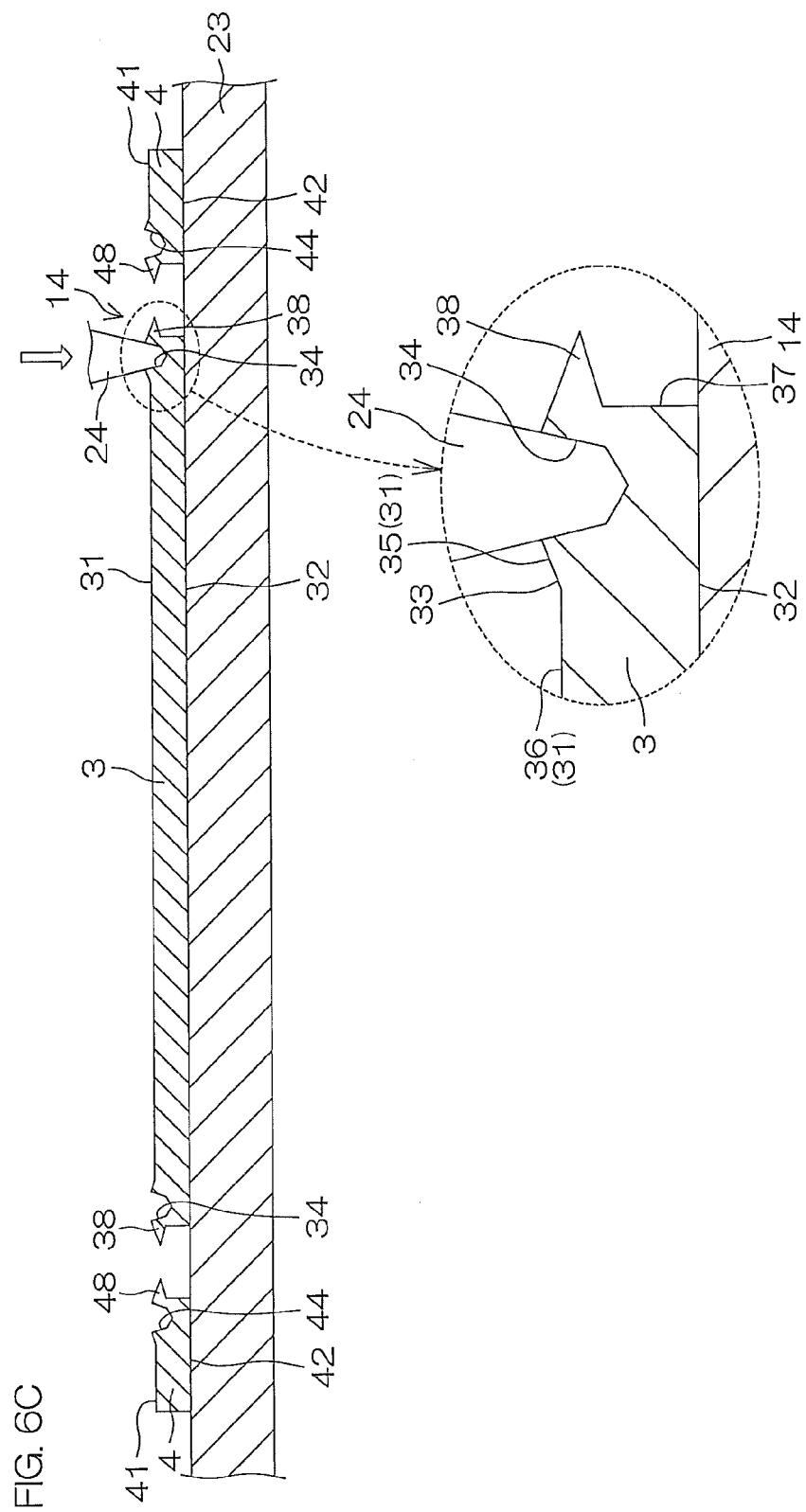
FIG. 6C is a schematic sectional view showing a next step of FIG. 6B.

Thereafter, as shown in FIG. 6C, as a result of the same step as FIG. 6B being performed for the remaining electrode leads 4, the pin recesses 44 are formed at the edge portions 43 of all electrode leads 4.

Then, as shown in FIG. 6C, by the same step as FIG. 6B, the stamping tool 24 is driven in order into the peripheral edge portion 33 of the die pad 3 along its sides. Accordingly, the pin recess 34 on the die pad 3 side is formed, the peripheral surface 35 of the die pad 3 surrounding the pin recess 34 rises, and the retainer portion 38 projects from the side surface 37 of the die pad 3 adjacent to the pin recess 34.

Figure 6D:
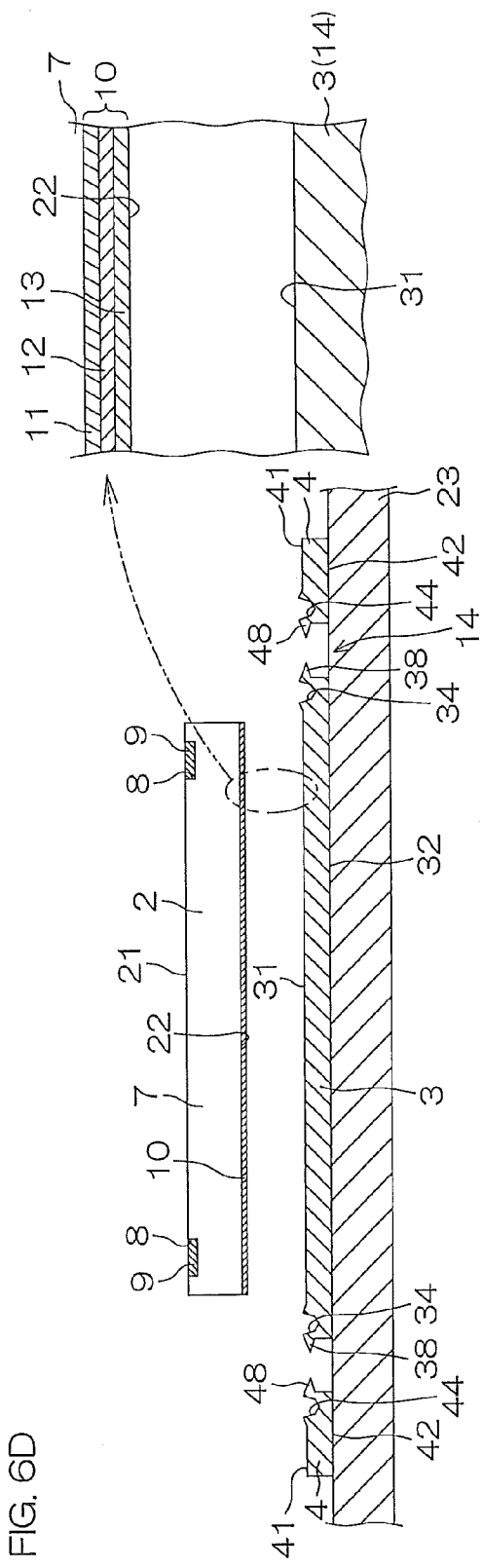
FIG. 6D is a schematic sectional view showing a next step of FIG. 6C.

On the other hand, as shown in FIG. 6D, as a result of the Au layer 11, the Ni layer 12, and the Cu layer 13 being stacked in order on the lower surface of the Si substrate 7, the back metal 10 is formed. Accordingly, the semiconductor chip 2 with the back metal 10 is prepared.

Then, as shown in FIG. 6E, a bonding paste 25 as a bonding material made of a Bi-based material containing Sn is applied to the front surface 31 of the die pad 3.

The content of Sn in the bonding paste 25 is preferably, for example, an amount that can be dispersed in full amount for Cu of the Cu layer 13 of the back metal 10 and the front surface 31 of the die pad 3, and is, for example, 4 wt % or less, preferably, 1 to 3 wt %, and more preferably, 1.5 to 2.5 wt %.

Figure 6F:
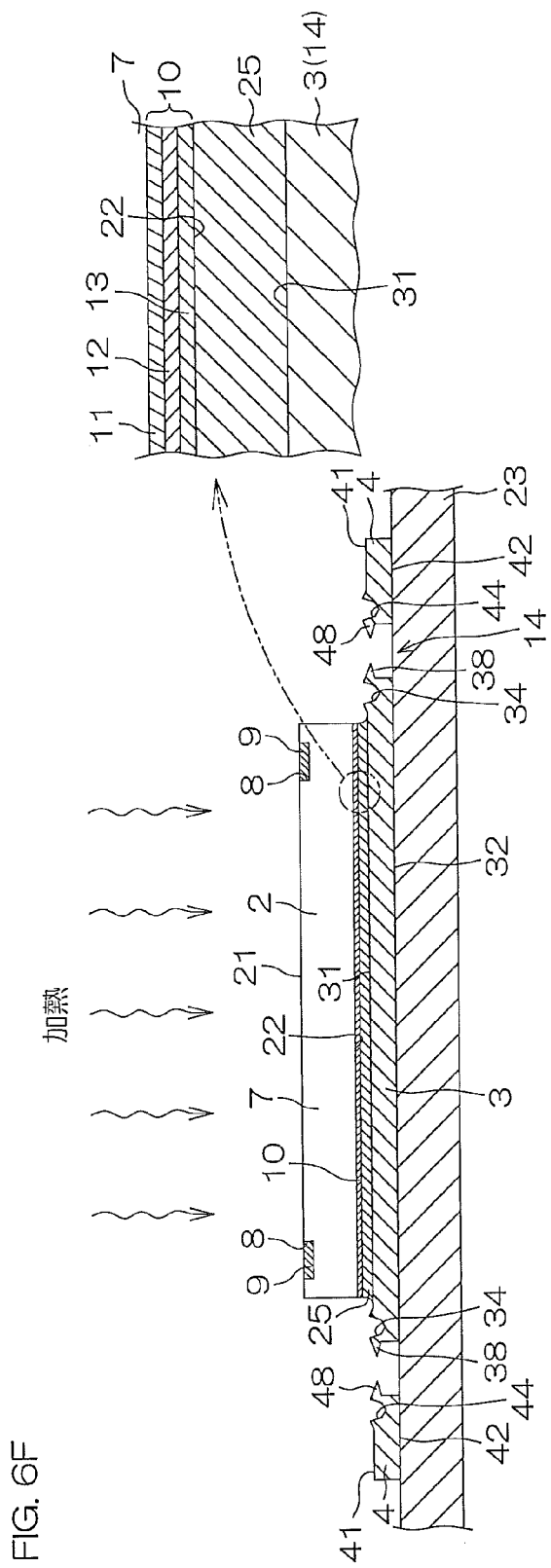
FIG. 6F is a schematic sectional view showing a next step of FIG. 6E.

After applying the bonding paste 25, as shown in FIG. 6F, the bonding paste 25 is sandwiched by the semiconductor chip 2 and the die pad 3 so that the Cu layer 13 of the back metal 10 contacts the bonding paste 25. Subsequently, for example, reflow (heat treatment) is carried out at 290° C. to 300° C.

Accordingly, as shown in FIG. 6G, each of the Cu layer 13 of the back metal 10 and Cu of the front surface 31 of the die pad 3 and Sn in the bonding paste 25 react with each other to form the Cu—Sn alloy layers 17, 18 in the vicinities of the Cu layer 13 and front surface 31. On the other hand, Bi in the bonding paste 25 hardly reacts with Cu, and thus remains, between the Cu—Sn alloy layers 17, 18, as the Bi-based material layer 16 sandwiched by these layers.

Thereafter, the electrode pads 9 of all semiconductor chips 2 and the electrode leads 4 corresponding to the electrode pads 9 are connected by the bonding wires 5, respectively.

After completion of the wire bonding, the lead frame 14 is set in a mold, and all semiconductor chips 2 are collectively encapsulated together with the lead frame 14 by the resin package 6.

After the encapsulation by the resin package 6, the stainless steel substrate 23 and the lead frame 14 are peeled away. Then, the die pad back surface plating 19 is formed on the back surface 32 of the die pad 3 exposed from the resin package 6, and simultaneously, the lead back surface plating 20 is formed on the back surface 42 of the electrode lead 4. Finally, by using a dicing saw to cut the lead frame 14 together with the resin package 6 into pieces of the size of semiconductor devices 1, the piece of the semiconductor device 1 shown in FIG. 1 is obtained.

As in the above, according to the method described above, the bonding paste 25 applied to the front surface 31 of the die pad 3 is sandwiched by the semiconductor chip 2 and the die pad 3 so as to contact the Cu layer 13 of the back metal 10. Thereafter, as a result of reflow (heat treatment) being carried out, the bonding layer 15 including the Bi-based material layer 16 and the Cu—Sn alloy layers 17, 18 is formed.

In formation of the bonding layer 15, the components (Bi-based material and Sn) in the bonding paste 25 do not contact metallic elements other than Cu, and further, the Cu—Sn alloy layers 17, 18 are formed on both sides of the Bi-based material layer 16 in the opposing direction of the semiconductor chip 2 and the die pad 3.

Therefore, contact between inhibitory metallic elements, such as Au in the Au layer 11 and Ni in the Ni layer 12 of the back metal 10, which may degrade the characteristics of the Bi-based material layer 16, and the Bi-based material layer 16 can be prevented. As a result, the formation of intermetallic compounds of Bi and the inhibitory metallic elements and the formation of eutectic compositions of Bi and the inhibitory metallic elements can be prevented. Consequently, not only can the temperature cycle resistance of the bonding layer 15 be improved, but the melting point of the bonding layer 15 can also be maintained high.

On the other hand, the Bi-based material layer 16 is in contact with the Cu—Sn alloy layers 17, 18, but since Cu hardly reacts with Bi, there is little possibility of the melting point of the bonding layer 15 lowering or the temperature cycle resistance decreasing due to contact between these layers.

Moreover, since the bonding layer 15 is made of the Bi-based material layer 16 and the Cu—Sn alloy layers 17, 18, lead-freeing of the bonding layer 15 can be achieved.

Moreover, the Cu—Sn alloy is not a hard and fragile metal like a Bi—Au alloy, a Bi—Ag alloy, or the like, but a high-strength metal. Therefore, the bonding strength of the semiconductor chip 2 and lead frame 14 and the bonding layer 15 can be improved by the Cu—Sn alloy layers 17, 18.

Moreover, since the Au layer 11 is in contact with the lower surface of the Si substrate 7, the Cu layer 13 and the Si substrate 7 can be made conductive with each other via the Au layer 11. Accordingly, the Si substrate 7 and the die pad 3 can be electrically connected with each other.

Moreover, since both of the front surface 31 of the die pad 3 and the front surface 41 of the electrode lead 4 are uncoated surfaces not coated with a metal thin film through a process such as plating or sputtering, it is unnecessary, in manufacturing of the semiconductor device 1, to apply a process such as plating or sputtering to the lead frame 14, so that the cost can be reduced.

Moreover, the configuration of the semiconductor device 1 according to the present embodiment can solve the following problem.

As the problem, conventionally, a package for high-density mounting has been used for which, in order to mount semiconductor devices at high density on a wiring board, extension of leads from a resin package is eliminated and lead thermals (terminal parts electrically connected with a semiconductor chip) of a lead frame are exposed on a lower surface of the package to allow surface mounting on the wiring board. Known examples of such a package for high-density mounting include leadless packages such as a QFN (Quad Flat Non-leaded Package) and an SON (Small Outlined Non-leaded Package).

In such a semiconductor package, further, a package (for example, HQFN: Heat sink Quad Flat Non-leaded Package) having a structure where the die pad (support portion on which the semiconductor chip is mounted) of the lead frame is exposed on the lower surface of the package so as to enhance heat radiation from the semiconductor chip has also been put into practical use.

In these modes of packages, a mounting surface of the lead frame to be packaged by a molding resin together with the semiconductor chip is exposed on the lower surface of the package. Therefore, there is a drawback that the lead terminals and die pad easily come off the package. For example, in a board bending test after packaging, the lead terminal and die pad may come off when an external force is applied to the package.

By making the lead terminals and die pad have substantially reverse tapered sectional shapes, their side surfaces are made to bite into the molding resin so as to prevent the lead terminals and die pad from coming off.

The sectional shapes as described above are formed by, for example, prior to packaging of the semiconductor chip and lead frame, etching the lead frame from its mounting surface side (back surface side) to remove the side surfaces of the lead terminals and die pad in part.

As the lead frame, a metal thin plate of approximately 100 μm to 200 μm has conventionally been used, but recently, a lead frame formed by a plating method has come to be used. For example, a method for forming a lead frame, on a substrate, by performing plating growth with a predetermined pattern has been studied. In such a method, since the thickness of the lead frame can be accurately controlled, a lower profile package may be realized by forming the lead frame thin.

However, the timing of peeling of the lead frame and substrate is after the lead frame has been packaged together with the semiconductor chip. Therefore, before packaging, the mounting surface of the lead frame (lead terminals and die pad) is covered with the substrate, and it is thus difficult to press the lead frame from its mounting surface side by etching. On the other hand, after packaging, even when the substrate is peeled away, the side surfaces of the lead frame have already been covered with the molding resin, it is thus difficult to process the side surfaces by etching.

For the above reason, when a lead frame is formed by a plating method, there is a drawback that forming a retaining structure of the lead frame is difficult.

Moreover, in the conventional lead frame, the entire region of its encapsulating surface at the opposite side to the mounting surface is the same plane, and is in planar contact with the molded resin, and thus there is also a drawback that the lead frame easily shifts horizontally with respect to the molding resin.

In the present embodiment, each of the side surfaces 37 of the die pad 3 and the side surfaces 47 of the electrode leads 4 is encapsulated by the resin package 6, and to the inside of the resin package 6 that encapsulates the side surfaces 37, 47, the retainer portions 38 on the die pad 3 side project from the side surfaces 37 and the retainer portions 48 on the electrode lead 4 side project from the side surfaces 47.

The retainer portions 38, 48 bite into the resin package 6 in horizontal directions perpendicular to the thickness direction of the lead frame 14. Therefore, when a force toward the lower surface side of the resin package 6 (exposed surface side of the lead frame 14) is applied to the lead frame 14 in the thickness direction of the lead frame 14, the retainer portions 38, 48 biting into the resin package 6 are caught therein. As a result, the lead frame 14 can be prevented from coming off.

Moreover, the front surface 31 of the die pad 3 is not the same plane in its entire region, but pin recesses 34 are formed in its peripheral edge portion 33, and the resin package 6 enters inside the pin recesses 34. Accordingly, the resin package 6 is fitted in part with the pin recesses 34. Moreover, similar to the front surface 31 of the die pad 3, the front surface 41 of the electrode lead 4 is not the same plane in its entire region, but a pin recess 44 is formed in its edge portion 43, and the resin package 6 enters inside the pin recess 44. Accordingly, the resin package 6 is fitted in part with the pin recess 44.

Therefore, when a force is applied to the lead frame 14 in the horizontal directions, the pin recesses 34, 44 are caught on the resin package 6 inside the pin recesses 34, 44. As a result, horizontal shifting of the lead frame 14 can be prevented.

Moreover, as a result of the peripheral surface 35 of the pin recess 34 rising in the front surface 31 of the die pad 3, the front surface 31 is bulging in part. Moreover, as a result of the peripheral surface 45 of the pin recess 44 rising in the front surface 41 of the electrode lead 4, the front surface 41 is bulging in part. Therefore, when the horizontal force is applied to the lead frame 14, the bulging peripheral surfaces 35, 45 serve as resistance to horizontal shifting. As a result, horizontal shifting of the lead frame 14 can be prevented more reliably.

Moreover, according to a method for manufacturing the semiconductor device 1, the pin recess 44 and the retainer portion 48 are formed, as shown in FIG. 6B, in the electrode lead 4, by driving the stamping tool 24 into the edge portion 43 of the front surface 41 at the opposite side to the back surface 42 to be exposed from the resin package 6. Moreover, as shown in FIG. 6C, in the same manner as in the electrode lead 4, the pin recess 34 and the retainer portion 38 are formed in the die pad 3.

Therefore, for example, even when the exposed surface (back surfaces 32, 42) of the lead frame 14 is covered with the stainless steel substrate 23 as a result of the lead frame 14 being formed by plating growth and etching from the back surface 32, 42 side is difficult, the retainer portions 38, 48 (retaining structure) can be reliably formed.

Moreover, since the lead frame 14 is pressed by using the stamping tool 24 that can be replaced with a capillary of a wire bonder, the pin recesses 34, 44 can be simply and accurately formed focusing on the peripheral edge portion 33 of the die pad 3 and the edge portions 43 of the electrode leads 4.

Further, since the lead frame 14 is formed by a plating method, the lead frame 14 can be formed thin by controlling the time of plating growth. As a result, a lower profile package can be realized.

In the first embodiment, for example, the deformed part formed as a result of the electrode lead 4 being deformed by driving of the stamping tool 24 is not limited to a minute circular pin recess, and may be, for example, a linear recess.

Moreover, in the case of being a pin recess, its shape is not limited to that shown in FIG. 4 and FIG. 5.

Figure 7:
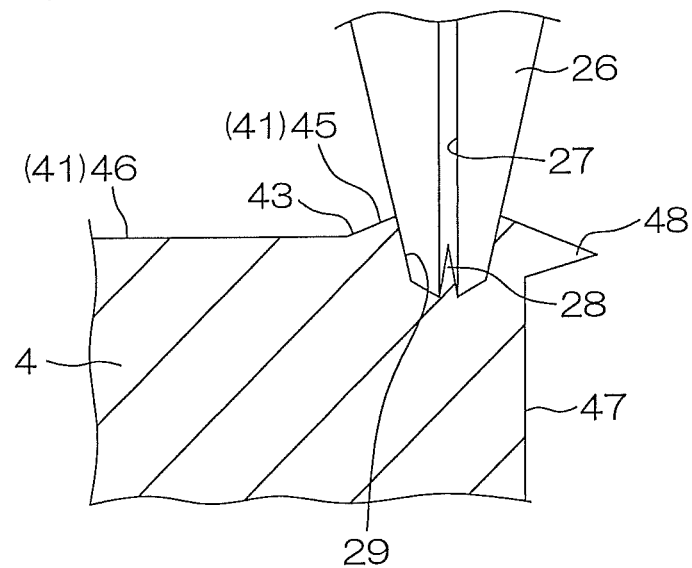
FIG. 7 is a view showing a first modification of the lead shown in FIG. 3.

For example, as shown as a first modification in FIG. 7, a pin recess 29 formed inside with a single protrusion 28 may be formed by vertically driving a capillary 26 (capillary 26 formed at its center with a single minute hole 27) to be used for wire bonding into the edge portion 43 on the die pad 3 side of the electrode lead 4.

Figure 8:
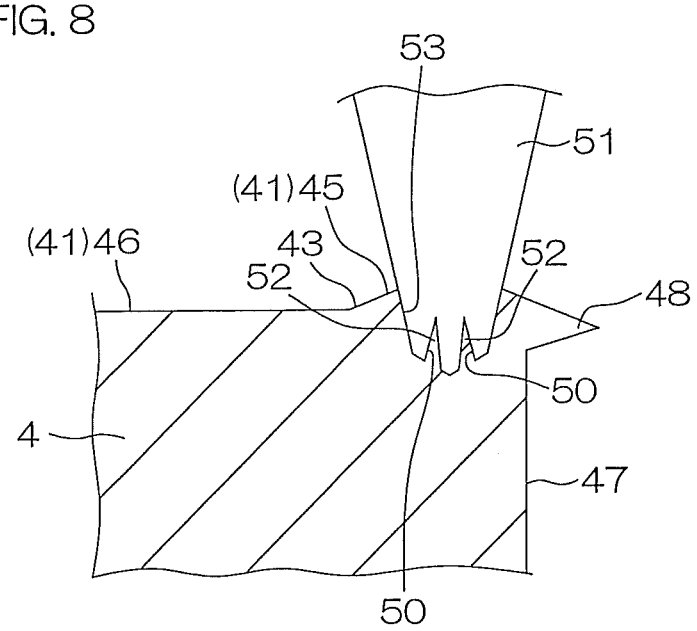
FIG. 8 is a view showing a second modification of the lead shown in FIG. 3.

Moreover, for example, as shown as a second modification in FIG. 8, a pin recess 53 formed inside with a plurality of protrusions 52 may be formed by vertically driving a stamping tool 51 formed at its tip with a plurality of minute holes 50 into the edge portion 43 on the die pad 3 side of the electrode lead 4.

In the first modification and second modification of the lead shown in FIG. 7 and FIG. 8, since the protrusions 28, 52 are formed inside the pin recesses 29, 53, the protrusions 28, 52 project to the inside of the resin package 6 within the pin recesses 29, 53. The protrusions 28, 52 allow, inside the pin recesses 29, 53, the electrode lead 4 (lead frame 14) to bite into the resin package 6. Therefore, a complicated fitting structure between the pin recesses 29, 53 and the resin package 6 can be provided. As a result, the fitting strength of the resin package 6 with respect to the pin recesses 29, 53 can be improved.

Moreover, the pin recess is not necessarily in a tapered shape whose diameter is reduced in the depth direction, and may be in a reverse tapered shape whose diameter is increased in the depth direction.

Figure 9:
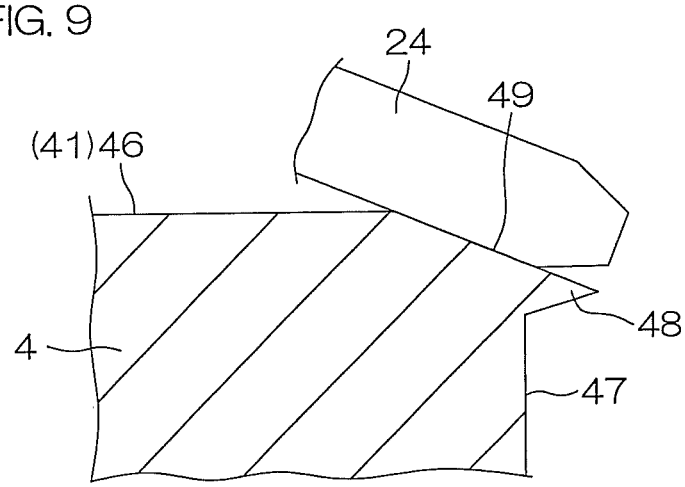
FIG. 9 is a view showing a third modification of the lead shown in FIG. 3.

Moreover, for example, as shown as a third modification in FIG. 9, the electrode lead 4 may be pressed and expanded to the side surface 47 side to form the retainer portion 48 by driving the stamping tool 24 at an acute angle with respect to the front surface 41, so as not to raise the front surface 41, into the edge portion 43 on the die pad 3 side of the electrode lead 4.

In that case, by adjusting the angle of the stamping tool 24 with respect to the front surface 41 to be small, as shown as a third modification in FIG. 9, a slope 49 (deformed portion) can be formed in the front surface 41 of the electrode lead 4 so that a dent of the stamping tool 24 does not bulge there.

Figure 10:
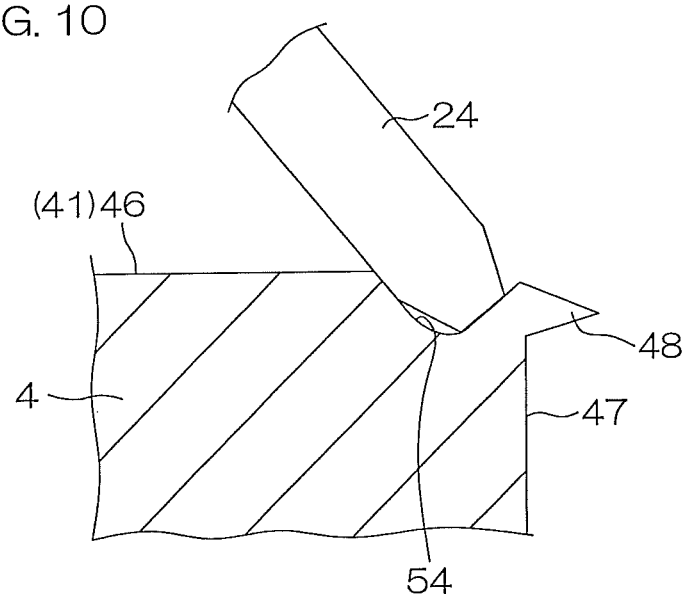
FIG. 10 is a view showing a fourth modification of the lead shown in FIG. 3.

On the other hand, as shown as a fourth modification in FIG. 10, a recess 54 can be formed in the front surface 41 of the electrode lead 4 by adjusting the angle of the stamping tool 24 with respect to the front surface 41 to be large.

The shapes of the first to fourth modifications of the lead shown in FIG. 7 to FIG. 10 can be applied also when the retainer portion 38 is formed in the side surface 37 of the die pad 3.

Figure 11:
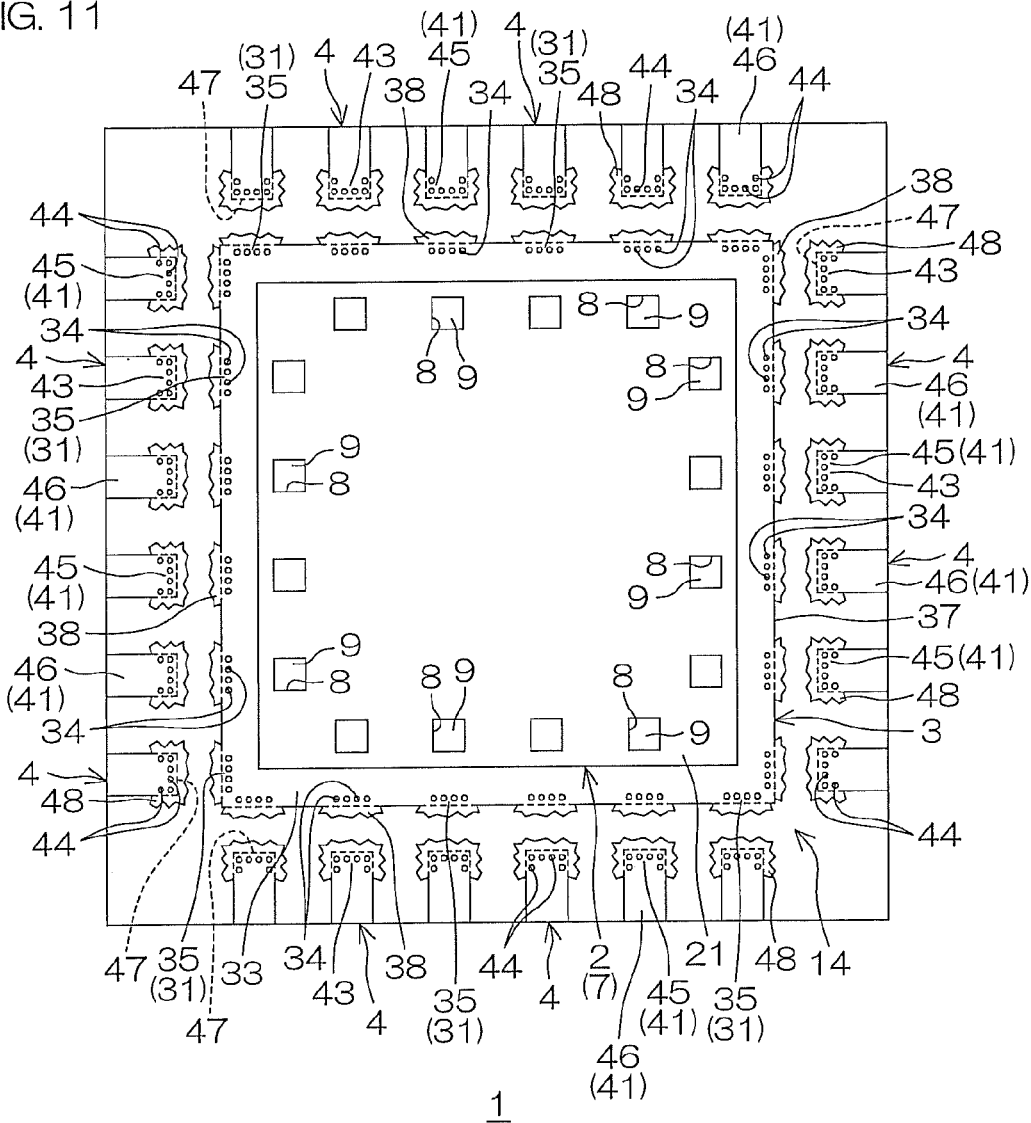
FIG. 11 is a view showing a modification of the layout pattern of pin recesses shown in FIG. 1.

Moreover, the number of pin recesses 44 to be formed in each electrode lead 4 is not limited to one, and may be a plural number. In that case, the plurality of pin recesses 44 may be disposed spaced from each other along the sides of the edge portion 43 of each electrode lead 4, as shown as a modification in FIG. 11.

Moreover, a description has been given that the back metal 10 has a three-layer structure in which the Au layer 11, the Ni layer 12, and the Cu layer 13 are stacked one each, but without limitation hereto, for example, at least one type of these layers may be stacked in a plurality of layers. In that case, the plurality of layers may be stacked successively, and another or other types of layers may be interposed between the layers.

Moreover, the back metal 10 may include layers different from an Au layer, a Ni layer, and a Cu layer. For example, the back metal 10 may include an Ag layer, a Ti layer, and the like. A Ti layer is capable of making ohmic contact with a Si semiconductor, and can thus be applied in place of the Au layer 11.

Second Embodiment

Figure 12:
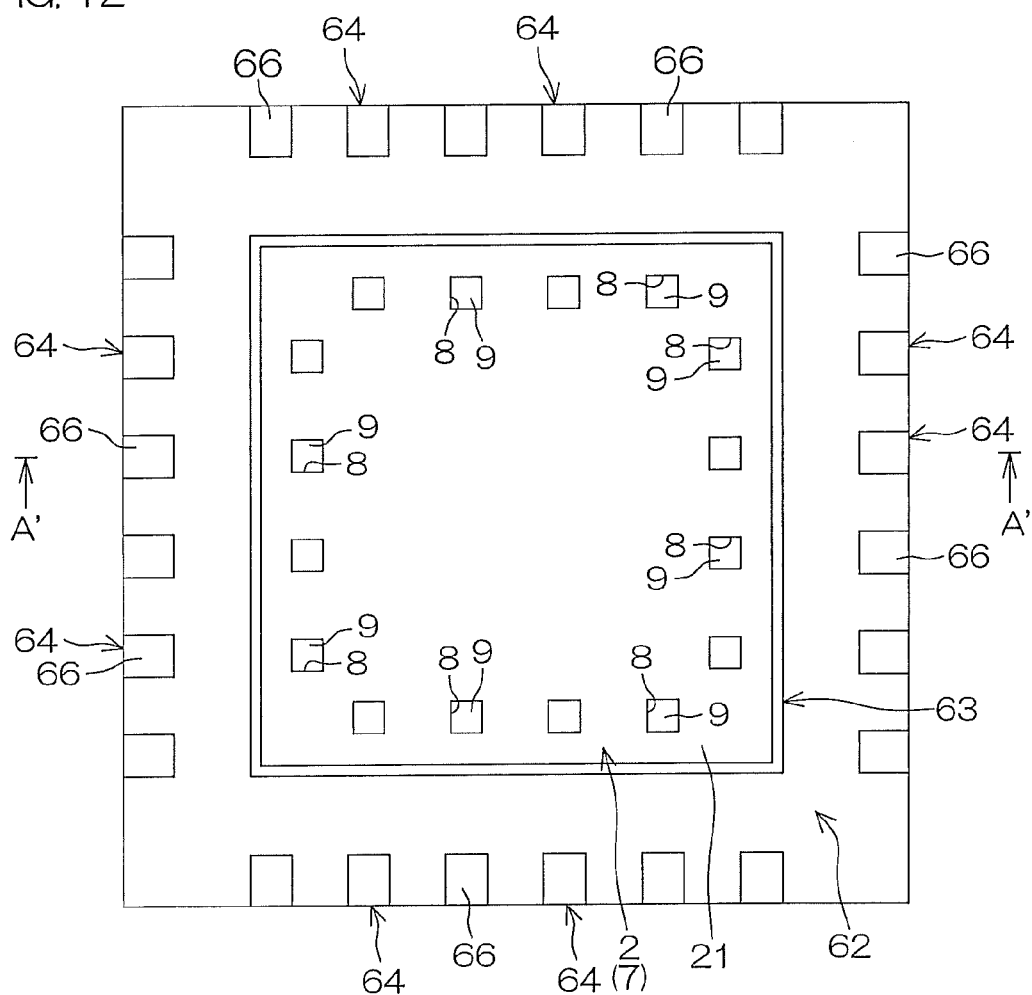
FIG. 12 is a schematic plan view of a semiconductor device according to a second embodiment of the present invention.
Figure 13:
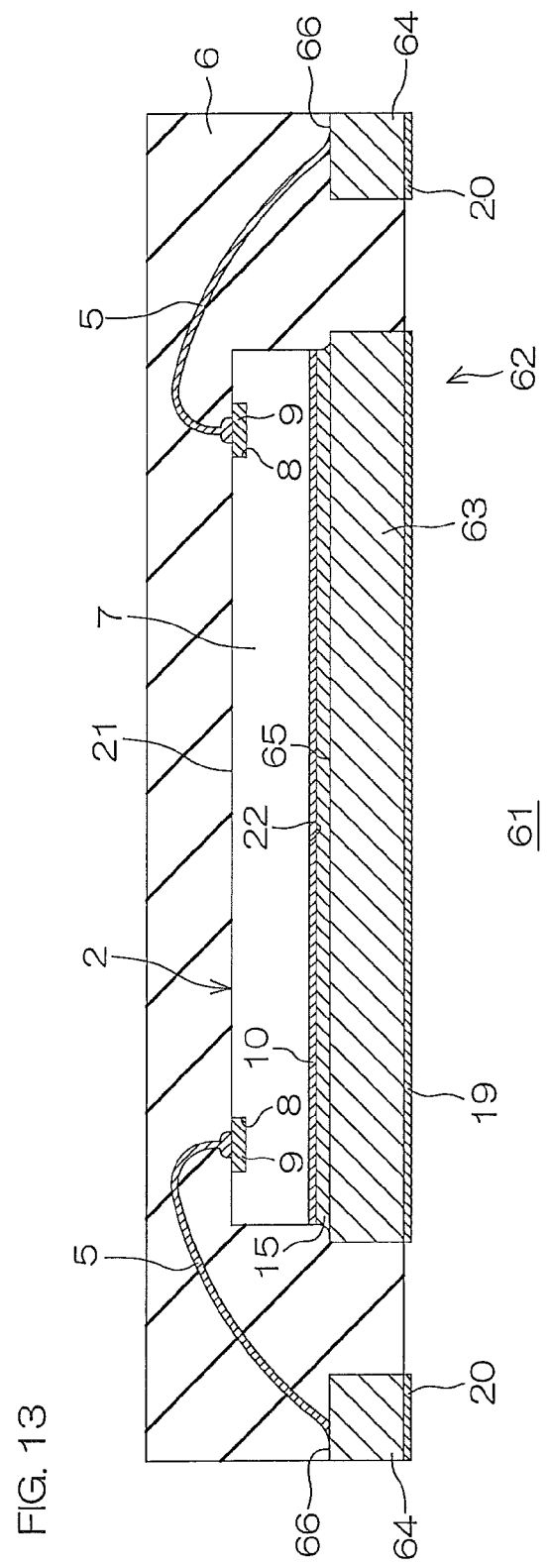
FIG. 13 is a schematic sectional view of the semiconductor device according to the second embodiment of the present invention, showing a section taken along a cut line A'-A' of FIG. 12.

FIG. 12 is a schematic plan view of a semiconductor device according to a second embodiment of the present invention. FIG. 13 is a schematic sectional view of the semiconductor device according to the second embodiment of the present invention, showing a section taken along a cut line A'-A' of FIG. 12. In FIG. 12 and FIG. 13, the configuration described in the foregoing first embodiment is denoted by the same reference signs, and description thereof is omitted.

The semiconductor layer 61 of the second embodiment includes a lead frame 62 made of a metal thin plate. The metal thin plate that forms the lead frame 62 is made from a Cu-based raw material mainly containing Cu, and specifically, made from, for example, high purity copper with a purity of 99.9999% (6N) or more or a purity of 99.99% (4N) or more or an alloy (for example, a Cu—Fe—P alloy) of Cu and a dissimilar metal. The metal thin plate may be made from, for example, an Fe-based raw material such as a 42 alloy (Fe-42% Ni). Moreover, the thickness of the lead frame 62 (metal thin plate) is, for example, 190 µm to 210 µm (preferably, approximately 200 µm).

Moreover, a die pad 63 and electrode leads 64 that form the lead frame 62 have, as their respective front surfaces 65 and 66, flat surfaces with no recesses formed, which is unlike the first embodiment. Other aspects of the configuration are the same as those of the first embodiment, and the advantageous effects are also the same.

In the first and second embodiments, for example, the sublayers of the bonding layer 15 are not necessarily the Cu—Sn alloy layers 17, 18, and may be Cu—Zn alloy layers made of an alloy of Cu and Zn that is a dissimilar metal not containing Cu and Pb, in which Cu is contained as a main component.

Figure 14:
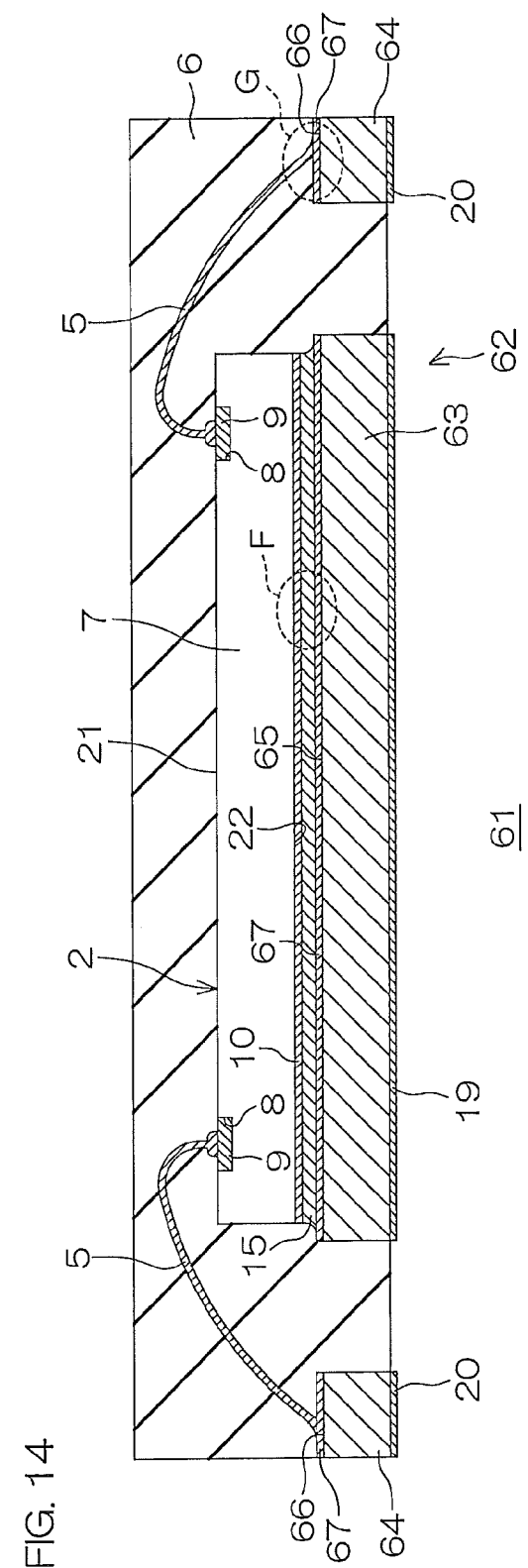
FIG. 14 is a view showing a modification of the lead frame shown in FIG. 13.

Moreover, for example, the front surface (front surface 65 of the die pad 63 and front surface 66 of the electrode lead 64) of the lead frame 62 is not necessarily an uncoated surface. As an example thereof, as shown as a modification of the second embodiment in FIG. 14, a coating layer 67 may be formed by a plating or sputtering process applied.

Figure 15:
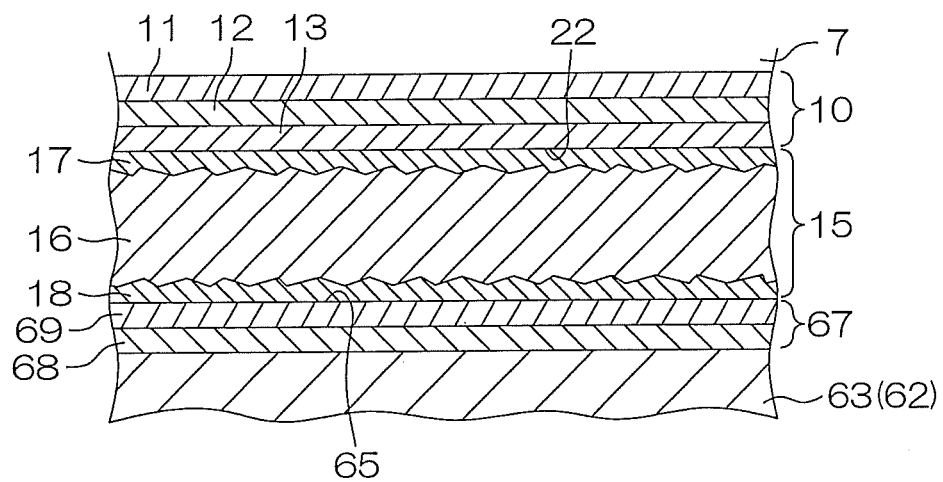
FIG. 15 is an essential-part enlarged view of a part surrounded by a dashed line circle F of FIG. 14.

The coating layer 67, on the front surface 65 of the die pad 63, has a two-layer structure in which, as shown in FIG. 15, an Ag layer 68 and a frame-side Cu layer 69 are stacked in order from the die pad 63 side. By stacking the frame-side Cu layer 69 on the Ag layer 68, Cu can be exposed on the whole of the opposing surface (front surface 65) to the semiconductor chip 2 in the die pad 63.

Figure 16:
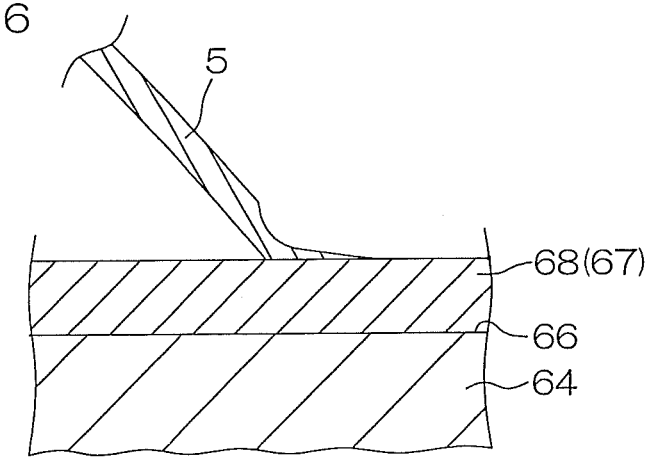
FIG. 16 is an essential-part enlarged view of a part surrounded by a dashed line circle G of FIG. 14.

On the other hand, the coating layer 67, on the front surface 66 of the electrode lead 64, has a single layer structure in which, as shown in FIG. 16, only an Ag layer 68 is formed. Accordingly, Ag can be exposed on the whole of the connecting surface of the bonding wire 5. Therefore, as the bonding wire 5 to be connected to the electrode lead 4, various wires such as not only a Cu wire but also an Au wire can be used.

In the case of the modification, for example, the frame-side Cu layer 69 may be used as an example of the die pad of the present invention. Accordingly, the lead frame 62 can be omitted (flameless). In the above, a description has been given of embodiments of the present invention, but the present invention can also be carried out in other modes.

For example, QFN type semiconductor devices have been mentioned in the foregoing embodiments, but the present invention can also be applied to semiconductor devices of other package types such as a QFP (Quad Flat Package) and an SOP (Small Outline Package).

The embodiments of the present invention are merely specific examples used to clarify the technical contents of the present invention, and the present invention should not be interpreted as being limited to only these specific examples, and the spirit and scope of the present invention shall be limited only by the accompanying claims.

Moreover, the components mentioned in the embodiments of the present invention can be combined in the scope of the present invention.

DESCRIPTION OF THE NUMERALS

1: Semiconductor device, 2: Semiconductor chip, 3: Die pad, 4: Electrode lead, 6: Resin package, 7: Si substrate, 9: Electrode pad, 10: Back metal, 11: Au layer, 12: Ni layer, 13: Cu layer, 14: Lead frame, 15: Bonding layer, 16: Bi-based material layer, 17: Cu—Sn alloy layer, 18: Cu—Sn alloy layer, 21: Front surface (of semiconductor chip), 22: Back surface (of semiconductor chip), 24: Stamping tool, 25: Bonding paste, 26: Capillary, 28: Protrusion, 29: Pin recess, 31: Front surface (of die pad), 32: Back surface (of die pad), 33: Peripheral edge portion (of die pad), 34: Pin recess, 35: Peripheral surface (of die pad), 37: Side surface (of die pad), 38: Retainer portion (of die pad), 41: Front surface (of electrode lead), 42: Back surface (of electrode lead), 43: Edge portion (of electrode lead), 44: Pin recess, 45: Peripheral surface (of electrode lead), 47: Side surface (of electrode lead), 48: Retainer portion (of electrode lead), 49: Slope, 51: Stamping tool, 52: Protrusion, 53: Pin recess: 54: Recess, 61: Semiconductor device, 62: Lead frame, 63: Die pad, 64: Electrode lead, 65: Front surface (of die pad), 66: Front surface (of electrode lead), 67: Coating layer, 68: Ag layer, 69: Frame-side Cu layer

What is claimed:

1. A method for manufacturing a semiconductor device comprising the steps of:
   preparing a semiconductor chip having a back surface made of a Cu layer;
   bonding the semiconductor chip to a die pad of a lead frame, the die pad having a front surface made of Cu via a bonding material containing a dissimilar metal not containing Cu and Pb and a Bi-based material so that the Cu layer and the bonding material come into contact with each other, the lead frame including the die pad and a plurality of leads disposed around the die pad;
   heat-treating the die pad after bonding the semiconductor chip;
   forming a deformed portion and a projecting portion projecting from a side surface of the lead frame, to be carried out prior to the step of bonding the semiconductor chip, by pressing, from a front surface side of the die pad and/or the lead of the lead frame, a peripheral edge portion of the front surface with a stamping tool to deform the front surface; and
   encapsulating the front surface side of the lead frame by a resin package so that the back surface of the lead frame is exposed.

2. The method for manufacturing a semiconductor device according to claim 1, wherein
   the semiconductor chip includes a Si substrate,
   the step of preparing a semiconductor chip includes the steps of:
   forming a metal layer capable of making ohmic contact with a Si semiconductor at a back surface of the Si substrate; and
   forming the Cu layer on the metal layer.

* * * * *